United States Patent
Jain

(10) Patent No.: US 6,621,304 B2
(45) Date of Patent: Sep. 16, 2003

(54) CLOCKING AND SYNCHRONIZATION CIRCUITRY

(75) Inventor: Raj Kumar Jain, Mandarin Gardens (SG)

(73) Assignee: Infineon Technologies Aktiengesellschaft, Munich (DE)

( * ) Notice: Subject to any disclaimer, the term of this patent is extended or adjusted under 35 U.S.C. 154(b) by 0 days.

(21) Appl. No.: 10/116,601

(22) Filed: Apr. 4, 2002

(65) Prior Publication Data

US 2003/0085742 A1 May 8, 2003

Related U.S. Application Data

(60) Provisional application No. 60/333,220, filed on Nov. 6, 2001.

(51) Int. Cl.$^7$ ............................ H03K 19/00; H03L 7/00
(52) U.S. Cl. ............................ 326/93; 326/96; 327/141; 375/371
(58) Field of Search ...................... 326/93, 96; 327/141, 327/144, 151, 153, 160, 161, 162; 375/371

(56) References Cited

U.S. PATENT DOCUMENTS

| 4,947,264 | A | * | 8/1990 | Narusawa ..................... 386/18 |
| 5,594,734 | A | * | 1/1997 | Worsley et al. ......... 370/395.53 |
| 5,914,991 | A | | 6/1999 | Gigandel et al. |
| 6,064,235 | A | * | 5/2000 | Hayashi et al. ................ 327/2 |
| 6,275,549 | B1 | | 8/2001 | Greatwood et al. |
| 6,278,718 | B1 | * | 8/2001 | Eschholz .................... 370/503 |
| 6,285,172 | B1 | | 9/2001 | Torbey |

* cited by examiner

Primary Examiner—Daniel Chang
Assistant Examiner—James Cho
(74) Attorney, Agent, or Firm—Dexter Chin

(57) ABSTRACT

A clocking and synchronization circuitry is disclosed. A plurality of windows is provided to accommodate jitters in a clock with respect to a reference clock. A plurality of delayed state cycles is generated from the clock signal for clocking internal operations within the clocked integrated circuit.

8 Claims, 6 Drawing Sheets

CLOCKING AND SYNCHRONIZATION CIRCUITRY

RELATED APPLICATIONS

This application claims priority of provisional patent application Ser. No. 60/333,220, filed on Nov. 6, 2001, which is incorporated herein by reference in its entirety.

FIELD OF THE INVENTION

The present invention relates generally to integrated circuits (ICs). More particularly, the invention relates to a clocking and synchronization circuitry for clocked integrated circuits.

BACKGROUND OF THE INVENTION

FIG. 1 is a block diagram showing the serial transmission of data between a transmitting unit 110 and a receiving unit 120 via data lines 130 and 132. The two units share a common data clock frequency (DCL) 134 and data bits are transmitted continuously at the rate dictated by the clock pulses. Typically, frame synchronization clock (FSC) signals 136 are transmitted to synchronize the transmission of data frames. Alternatively, the FSC signals may be embedded within data frames. Examples of transmitting and receiving units include integrated circuits that operate in conjunction with one another, such as the central processing unit (CPU) of a microprocessor or digital signal processor (DSP) and input/output (I/O) devices.

Referring to FIG. 1, a conventional phase-locked loop (PLL) arrangement is used to generate a different frequency nDCL (142) on its output for internal operations in the hardware block 160, the output frequency being derived from a reference frequency. In this example, the reference frequency is provided by the common data clock (DCL). The output clock signal (nDCL) from the PLL (140) has a frequency that is a multiple (n-times) of the input DCL signal (where n is a real number from 1 to N). The clock signal nDCL serves as the internal clock signal and is propagated within the receiving integrated circuit to any ICs in the hardware block 160 generating or processing data for the transmitting device.

However, a problem exists if the clock signals DCL and nDCL are not synchronized. Power supply noise and random variations in processing, voltage and temperature conditions may cause a jitter in the PLL output clock nDCL with respect to the reference clock DCL. The effects of clock jitter range from not having any effect on the system to rendering the system completely non-functional, including loss of data integrity.

As evidenced from the above discussion, it is desirable to provide an improved synchronization circuitry for integrated circuits to maximize overall performance.

SUMMARY OF THE INVENTION

The invention relates generally to synchronization circuitry. In particular, the invention relates to improved clocking circuitry for synchronizing clock signals in integrated circuits.

According to the invention, a plurality of windows is provided to accommodate jitters in a clock signal relative to a reference clock. A plurality of delayed state cycles is generated from the clock signal for internal operations within the integrated circuit.

PREFERRED EMBODIMENTS OF THE INVENTION

The invention relates to an improved clocking circuitry for synchronizing clock signals in integrated circuits. Illustratively, a PLL arrangement is used to generate different frequencies for internal operations, allowing the internal circuitry to operate at higher speeds. The PLL output clock signal nDCL has to be synchronized with the reference clock to avoid loss in data integrity and system failure.

Figure 1:
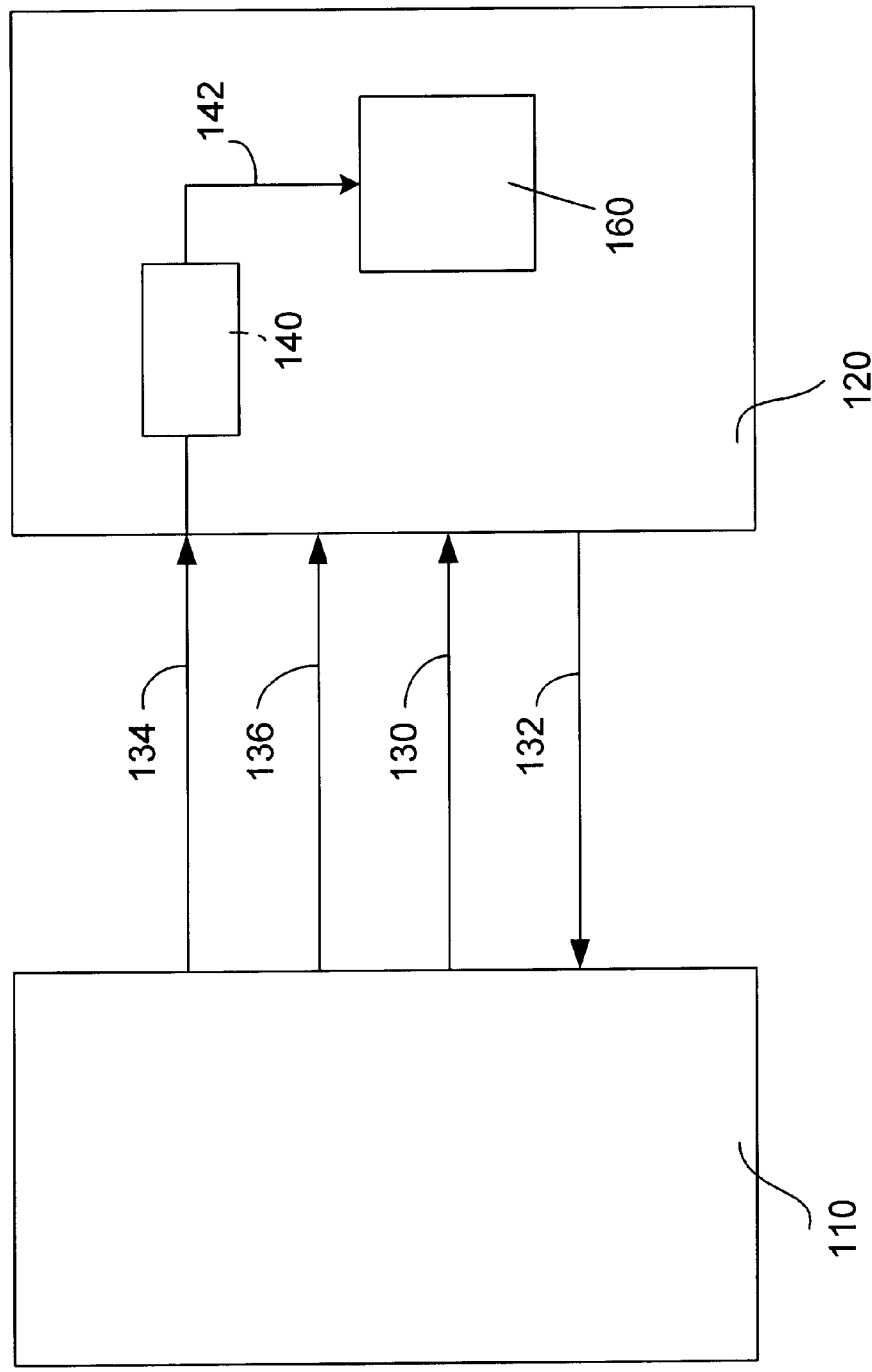
FIG. 1 shows a block diagram of the interface for serial transmission.
Figure 2:
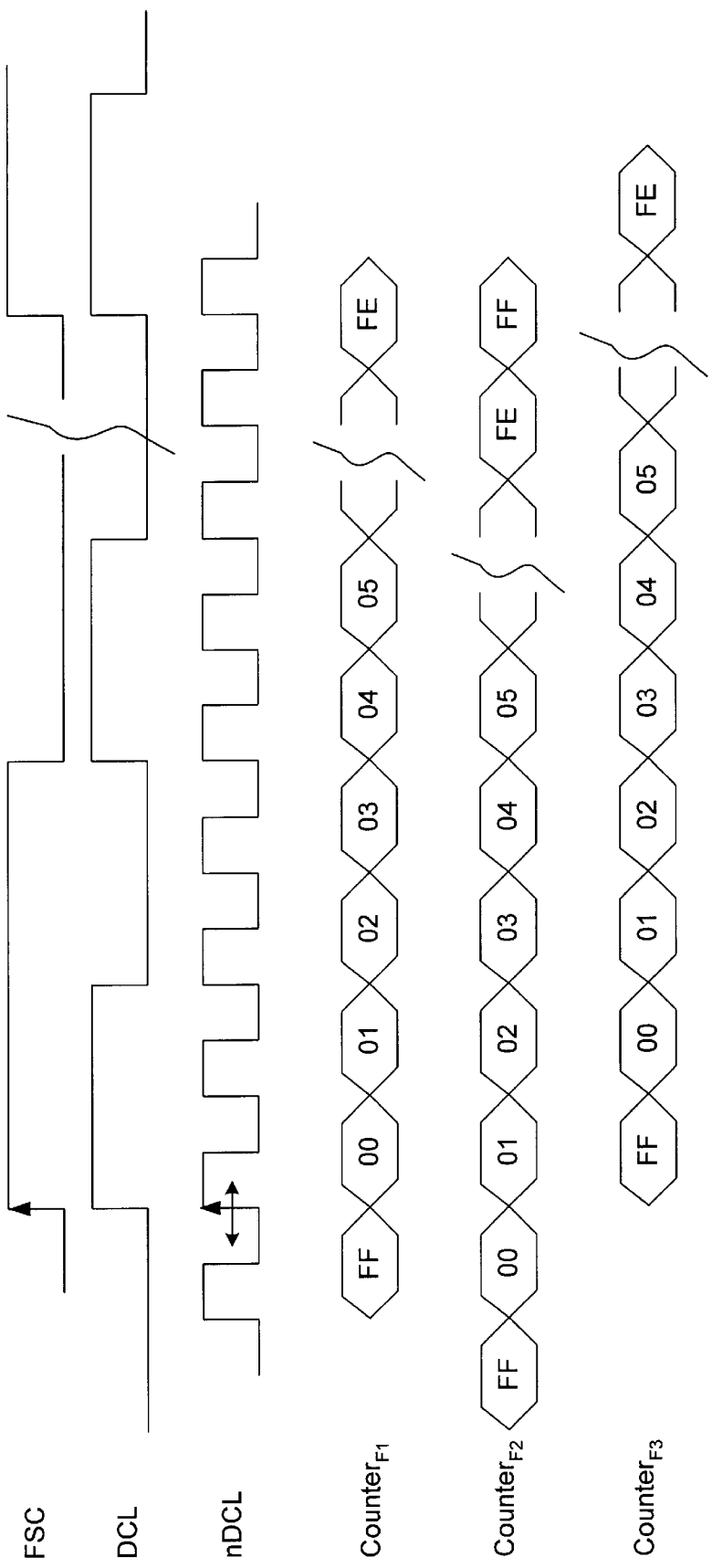
FIGS. 2–5 are timing diagrams showing the timing relationships during data transfers.

FIG. 2 shows a timing diagram that illustrates the problem of a cycle—cycle jitter, during which the PLL output clock nDCL is not synchronized with the reference clock. In this example, the input data clock (DCL) acts as the reference clock, the reference clock comprising a plurality of reference clock frames. In one embodiment, the frame synchronization clock (FSC) is provided to synchronize the transmission of the reference clock frames, wherein the first active edge of the FSC indicates the start of a reference clock frame.

A plurality of state frames (e.g. F1, F2, F3 . . . ) are generated from the clock signal nDCL, each state frame comprising a plurality of state cycles. It is noted that the state frames F1, F2, F3, . . . do not necessarily occur consecutively according to the numbering. In one embodiment, a free-running tracking counter keeps track of the number of state cycles (e.g. 00, 01, . . . FE, FF, . . . ) used per state frame for internal operations. For example, Counter$_{F1}$ keeps track of the number of state cycles used in frame F1 and Counter$_{F2}$ keeps track of the number of state cycles used in frame F2. Illustratively, the PLL generates 512 nDCL cycles for every 128 DCL cycles during one frame. Hence, 512 state cycles will be generated for every state frame. Other frequencies are also useful.

However, if nDCL is not synchronized with DCL, the free-running tracking counter may start earlier or later relative to the start of a frame, such as during frames F2 or F3. Hence, the internal operations clocked by the state cycles may not be synchronized with the transmittal of the input data clocked by DCL, resulting in loss of data integrity.

Figure 3:
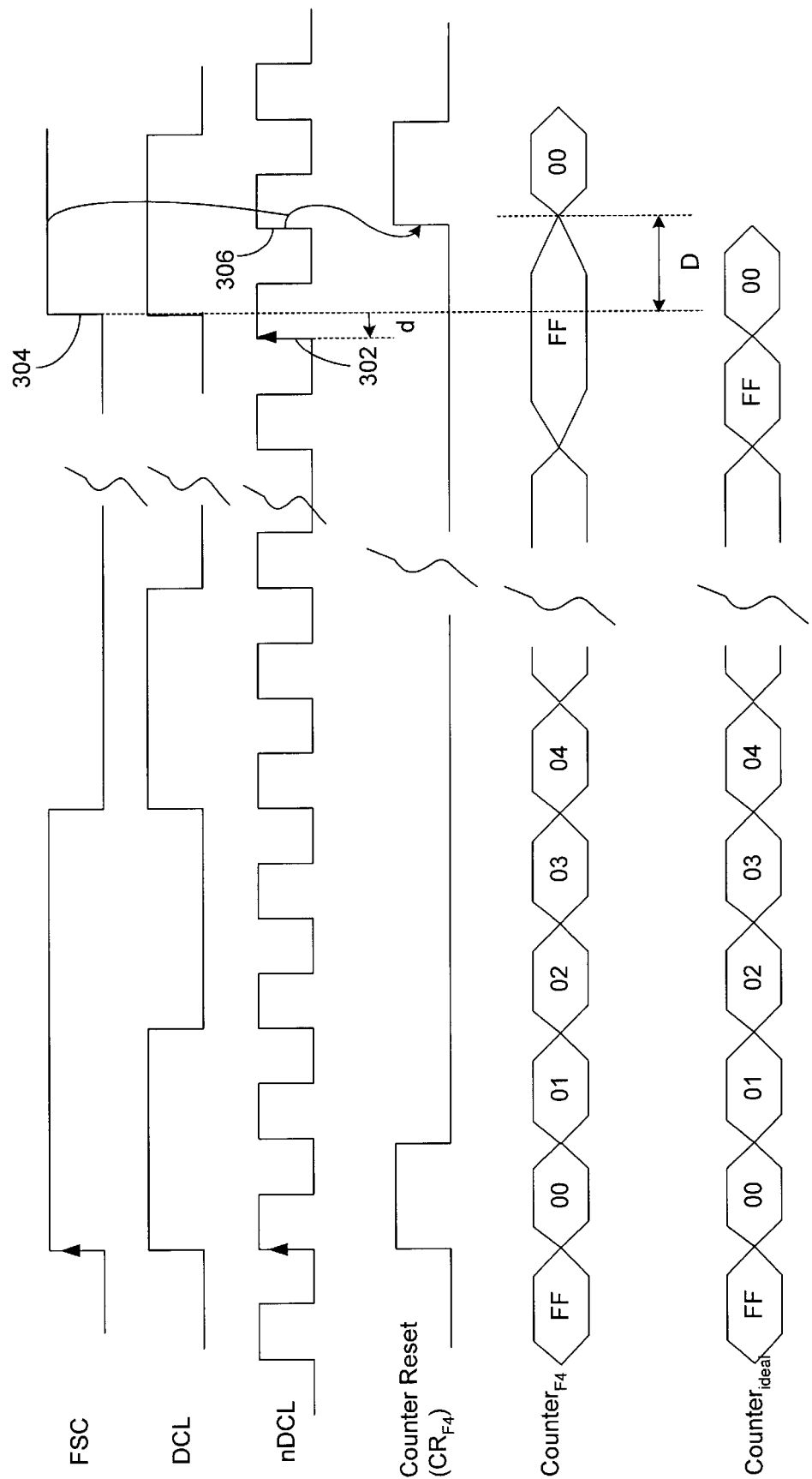
Figure 4:
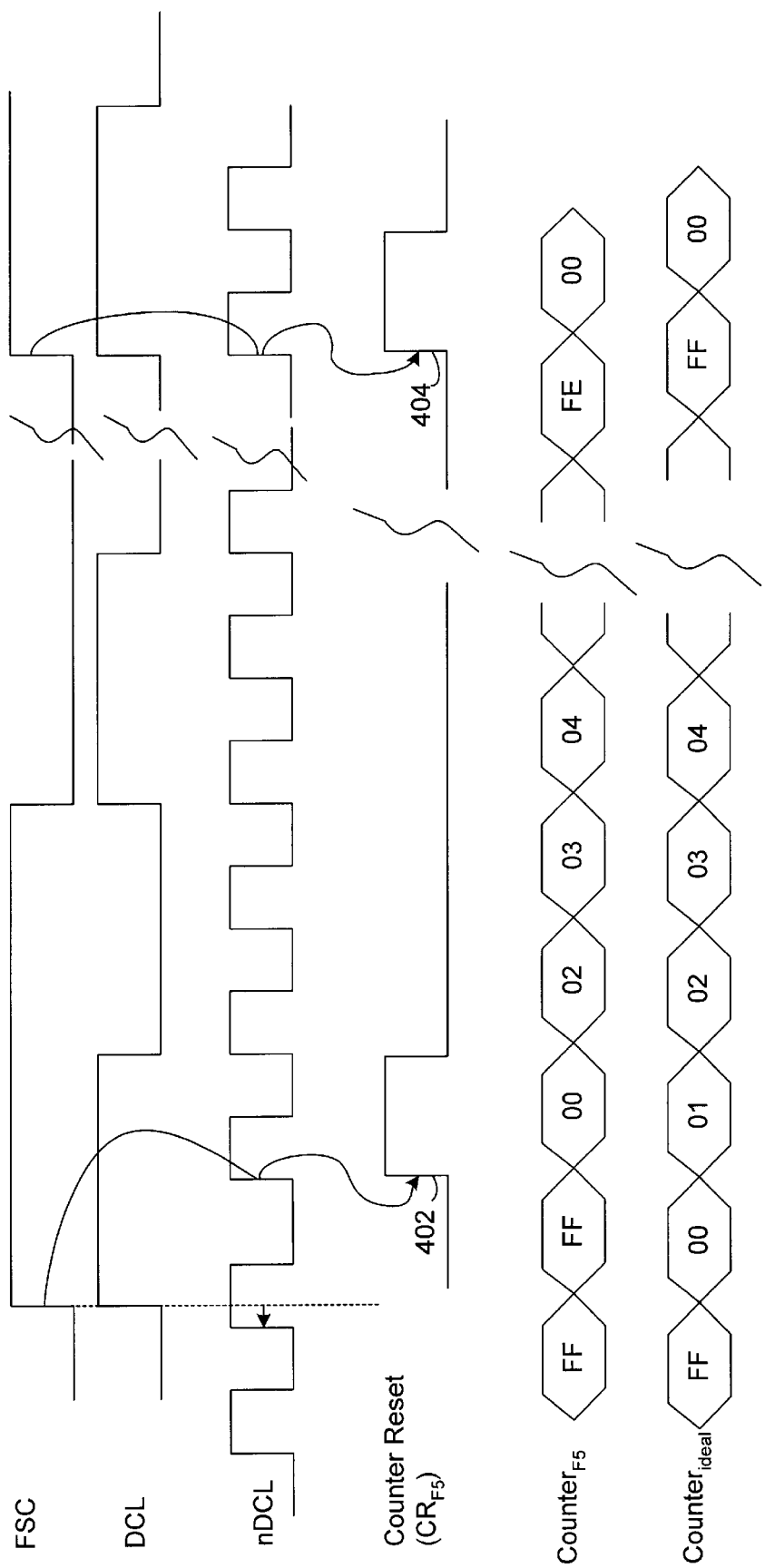

One approach is to use a counter reset signal (CR) to reset the tracking counter to '00' at the start of a frame, which coincides with the first active edge of nDCL when FSC is active. However, it has been discovered that a problem exists if the reset signal CR is activated too early relative to the start of a frame due to a jitter in nDCL. At the start of a new frame shown in FIG. 3, the first active edge 302 of nDCL is slightly early with respect to the first active edge of FSC 304. Since FSC is still inactive at the first active edge of nDCL in the next frame, the Counter$_{F4}$ stops at the maximum counter value 'FE' until the activation of CR$_{F4}$ at the second active edge 306 of nDCL. Hence, a small jitter d (e.g. 0.2 ns) in nDCL may result in a large delay D of up to 1 clock cycle (e.g. 10 ns) in the tracking counter, resulting in an additional state cycle per frame. FIG. 4 shows the situation when the counter reset CR$_{F5}$ is activated late at 402 relative to the start of a frame and almost exactly at the start of the next frame at 404. The tracking counter Counter$_{F5}$ is reset to '00' after 'FE' before it reaches the maximum value 'FH'. Hence, a small jitter in nDCL may cause a loss of one state cycle or a gain in one state cycle subsequently.

Figure 5:
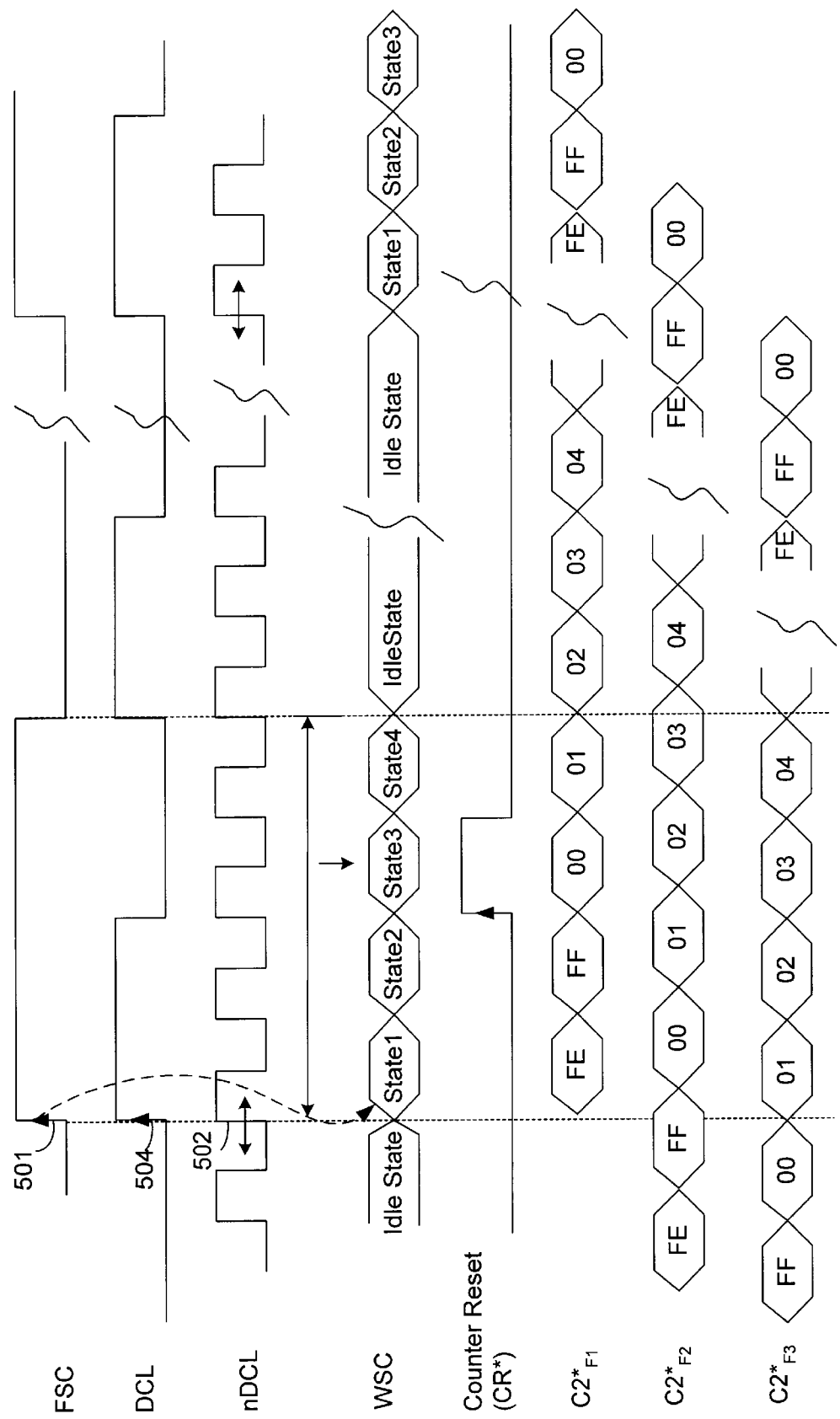

In accordance with the invention, a plurality of windows is provided to accommodate jitters in the clock nDCL with respect to the reference clock DCL. As shown in FIG. 5, a window is initiated at the start of a reference clock frame, which coincides, for example, with the first active edge 501 of the FSC. In one embodiment, the window may be first set up during chip reset or PLL initialization.

In one embodiment, the windows are provided by a window state counter WSC, wherein the width of a window is m clock cycles to accommodate the maximum drift in the output clock signal of the PLL, where m is a real number from 1 to M, and m is typically less than the width of the reference clock frame. Illustratively, m is set to 4. In one embodiment, the window state counter WSC is triggered by the first active edge 501 of PSC.

A plurality of delayed state frames is generated from the clock nDCL to run internal operations of the system, the delayed state frames comprising a plurality of delayed state cycles. In one embodiment, the delayed state cycles are provided by a tracking counter C2*, which tracks the number of cycles used for internal operations per frame. The tracking counter C2* is clocked by nDCL and reset to '00' by the counter reset signal CR*. Each state frame has a reference state cycle, which in one embodiment shown in FIG. 5, is state cycle '00'. During resets, the reset signal CR* is activated at the kth reference cycle of the window, where k is a real number from 1 to K and k<m. Illustratively, k is set to 3. Hence, a reset introduces an offset of k cycles between the start of the delayed state frames and the start of the frame (i.e. active edge of FSC), and aligns the reference state cycle within the window. A reset is preferably first done during initialization during system start-up.

In one embodiment, the tracking counter C2* is allowed to run freely if the reference state cycle of the delayed state frame occurs within the window. If there is no jitter in nDCL, the tracking counter C2* starts from '00' after an offset of k cycles, as shown by $C2*_{F1}$.

If a jitter occurs, for example, at the start of frame F2, wherein the first active edge 502 of nDCL is early with respect to the first active edge 504 of DCL, the tracking counter $C2*_{F2}$ is allowed to run freely if it clocks the reference state cycle '00' within the window. Hence, the system anticipates the possibility of jitter in nDCL and a slight jitter in nDCL will not cause a large delay in the state frames provided by C2*, like the example illustrated in FIG. 3.

If the reference state cycle of the delayed state frame is not detected within the window, a reset is initiated. Referring to the embodiment shown in FIG. 5, if the tracking counter C2* reaches '00' before or of after the window state cycles (i.e. State1, State2, State3 and State4), such as in frame F3, the counter reset signal CR* is activated at the kth reference cycle of the window. The reference state cycle is aligned within the window for the next state frame and the system is reset. The width of the window m is chosen such that the probability of system reset caused by the reference state cycle occurring outside the window is very low.

Figure 6:
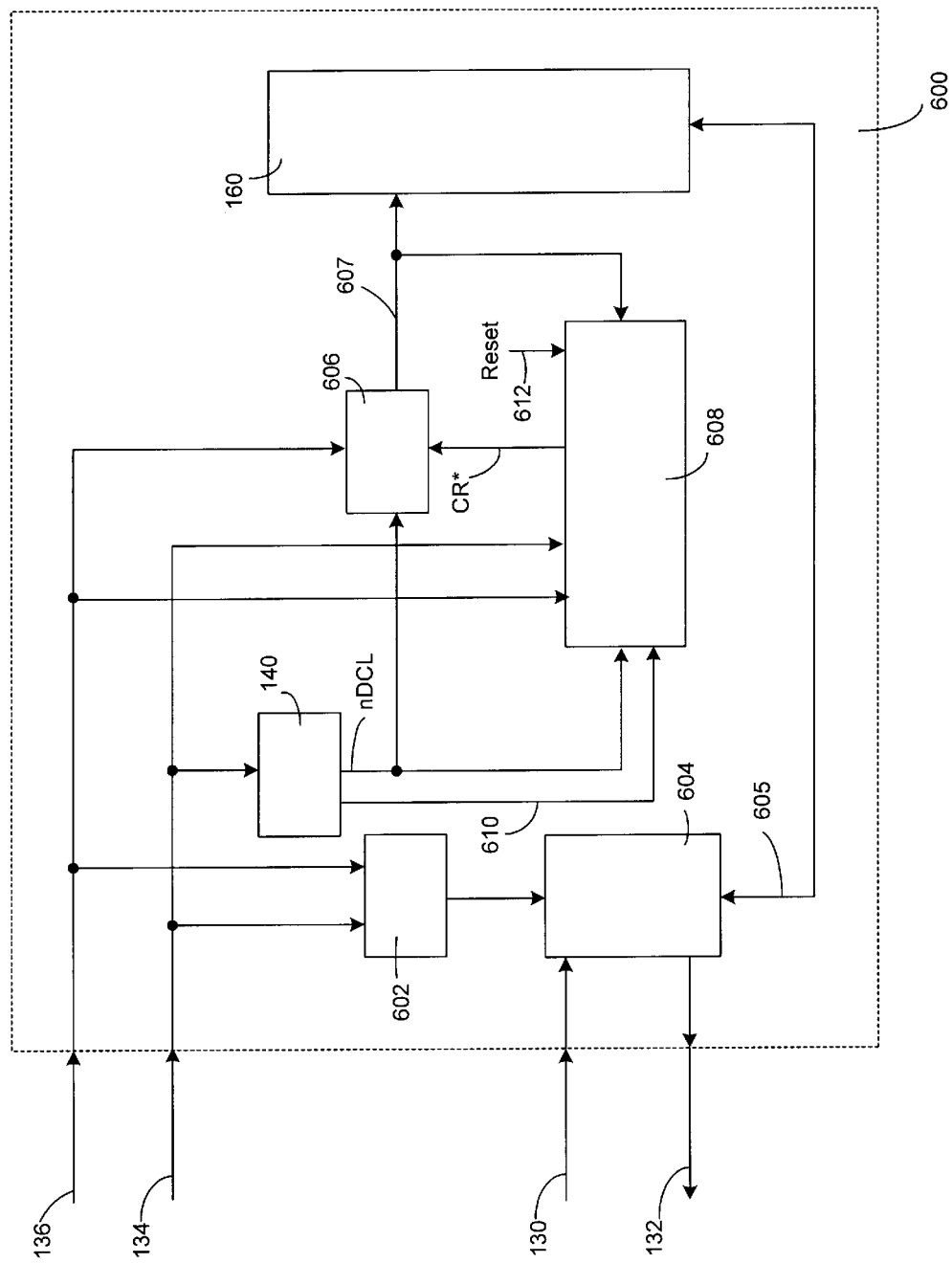
FIG. 6 shows a block diagram of one embodiment of the invention.

FIG. 6 shows a system block diagram 600 of a clocking circuitry according to one embodiment of the invention. In one embodiment, the frame synchronization clock FSC 136 and data clock DCL 134 are passed to an interface counter C1 (602) to clock the data transfer operations in the serial interface 604. In one embodiment, data bits are transmitted via data lines 130 and 132. The data bits are then transmitted between the serial interface and the system hardware block 160 via data bus 605.

The DCL signal 134 is passed to the PLL 140 to increase the clock frequency for clocking internal operations. In one embodiment, the output clock signal nDCL from the PLL is passed to a tracking counter C2* (606) for generating delayed state frames. The delayed state frames comprise a plurality of delayed state cycles having a reference state cycle, the delayed state cycles being applied to the system hardware block 160 via signal line 607 to clock internal operations. In one embodiment, the tracking counter C2* is first triggered by the counter reset signal CR* during initialization and reset by CR* during resets, the reset signal CR* being generated by the frame synchronizer 608.

In one embodiment, the frame synchronizer 608 comprises the window state counter WSC. The window state counter WSC is triggered by the first active edge of FSC at the start of each frame. The reset signal CR* is activated at the kth reference cycle of the window during resets. In one embodiment, a reset condition happens when a reference state cycle of the tracking counter C2* (606) occurs outside the window. In one embodiment, the DCL and FSC may be synchronized in a similar fashion.

The clock signal nDCL and DCL may be passed to the frame synchronizer 608 if required. Other initialization signals, such as the PLL lock signal, may be passed from the PLL to the frame synchronizer 608 via signal line 610. In one embodiment, the frame synchronizer may be initialized by an external Reset signal applied at signal line 612.

While the invention has been particularly shown and described with reference to various embodiments, it will be recognized by those skilled in the arc that modifications and changes may be made to the present invention without departing from the spirit and scope thereof. The scope of the invention should therefore be determined not with reference to the above description but with reference to the appended claims along with their full scope of equivalents.

What is claimed is:

1. A method of synchronizing a clock with a reference clock in an integrated circuit, comprising:

receiving said clock and said reference clock, said reference clock comprising a plurality of reference clock frames;

providing a plurality of windows to accommodate jitters in the clock with respect to the reference clock, a window being initiated at the start of a reference clock frame;

generating a plurality of delayed state frames from said clock for internal operations in the integrated circuit, the delayed state frames comprising a plurality of state cycles, each state frame having a reference state cycle;

initiating a reset if the reference state cycle of a delayed state frame occurs outside the window; and aligning the reference state cycle within the window during resets.

2. The method of claim 1 wherein the state cycles are generated by a tracking counter.

3. The method of claim 2 wherein the tracking counter is reset by a counter reset signal.

4. The method of claim 1 wherein the window is provided by a window state counter.

5. The method of claim 1 wherein a width of the window is less than a width of the reference clock frame.

6. The method of claim 1 further comprising the step of aligning the reference state cycle within the window during initialization.

7. Apparatus for synchronizing a clock with a reference clock, comprising:

a tracking counter for generating delayed state frames, the delayed state frames comprising a plurality of state cycles, each delayed state frame having a reference state cycle, the delayed state frames being applied to a system hardware block to clock internal operations, the tracking counter being reset by a counter reset signal; and a frame synchronizer for initiating a reset by asserting the counter reset signal, whereby the reset is initiated when the reference state cycle of a delayed state frame occurs outside a window, wherein the reset aligns the reference state cycle within the window.

8. The apparatus of claim 7 wherein the frame synchronizer includes a window state counter for providing a plurality of windows to accommodate jitters in said clock with respect to said reference clock, the window being initiated at the start of a reference clock frame.

* * * * *